(12) United States Patent
Zimmer

(10) Patent No.: US 9,207,291 B2
(45) Date of Patent: Dec. 8, 2015

(54) XMR ANGLE SENSORS

(75) Inventor: Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 853 days.

(21) Appl. No.: 12/950,456

(22) Filed: Nov. 19, 2010

(65) Prior Publication Data

US 2012/0126806 A1 May 24, 2012
US 2015/0145508 A9 May 28, 2015

Related U.S. Application Data

(63) Continuation-in-part of application No. 11/941,853, filed on Nov. 16, 2007, now Pat. No. 7,872,564.

(51) Int. Cl.
*G01R 33/09* (2006.01)
*B82Y 25/00* (2011.01)
*G01B 7/30* (2006.01)
*G01R 33/00* (2006.01)
*H01L 43/08* (2006.01)

(52) U.S. Cl.
CPC .............. *G01R 33/091* (2013.01); *B82Y 25/00* (2013.01); *G01B 7/30* (2013.01); *G01R 33/0052* (2013.01); *G01R 33/093* (2013.01); *G01R 33/096* (2013.01); *G01R 33/098* (2013.01); *H01L 43/08* (2013.01); *Y10T 29/49002* (2015.01)

(58) Field of Classification Search
CPC ............................. G01D 5/145; G01D 33/093
USPC ............................................ 324/252, 207.21
See application file for complete search history.

(56) References Cited

U.S. PATENT DOCUMENTS

| | | | |
|---|---|---|---|
| 6,002,553 A | 12/1999 | Stearns | |
| 6,232,776 B1 | 5/2001 | Pant | |
| 6,529,352 B1 | 3/2003 | Urai | |
| 6,707,122 B1 | 3/2004 | Hines | |
| 7,265,540 B2 | 9/2007 | Sudo | |
| 7,495,434 B2 | 2/2009 | Zimmer | |
| 7,678,585 B2 | 3/2010 | Zimmer | |
| 7,682,840 B2 | 3/2010 | Hiebert | |
| 7,872,564 B2 * | 1/2011 | Zimmer et al. | ............... 338/195 |
| 2004/0257714 A1 | 12/2004 | Takahashi | |
| 2006/0202291 A1 | 9/2006 | Kolb | |
| 2008/0074224 A1 | 3/2008 | Castano | |
| 2008/0088982 A1 | 4/2008 | Folks | |
| 2009/0015252 A1 | 1/2009 | Raberg | |
| 2009/0128282 A1 | 5/2009 | Zimmer | |
| 2012/0134057 A1 | 5/2012 | Song | |

FOREIGN PATENT DOCUMENTS

CN 1902465 A 1/2007
DE 4327458 C2 2/1995

(Continued)

OTHER PUBLICATIONS

Chinese Application No. 201110367746.2, Chinese Office Action, mailed Feb. 24, 2014, 8 pages.

*Primary Examiner* — Reena Aurora
(74) *Attorney, Agent, or Firm* — Eschweiler & Associates, LLC

(57) ABSTRACT

Embodiments relate to xMR sensors, sensor elements and structures, and methods. In an embodiment, a sensor element comprises a non-elongated xMR structure; and a plurality of contact regions formed on the xMR structure spaced apart from one another such that a non-homogeneous current direction and current density distribution are induced in the xMR structure when a voltage is applied between the plurality of contact regions.

24 Claims, 11 Drawing Sheets

(56) References Cited

FOREIGN PATENT DOCUMENTS

| DE | 196 08 730 | A1 | 9/1997 |
| DE | 19839450 | B4 | 3/2000 |
| DE | 103 27 390 | A1 | 1/2005 |
| DE | 10 2005 004 126 | A1 | 8/2005 |
| DE | 102005047482 | A1 | 4/2007 |
| DE | 10 2006 050 833 | A1 | 5/2008 |
| DE | 10 2007 032 867 | A1 | 1/2009 |
| DE | 10 2008 054 314 | A1 | 6/2009 |
| WO | WO 2004074764 | A2 | 9/2004 |
| WO | WO 2005075943 | A1 | 8/2005 |

* cited by examiner

XMR ANGLE SENSORS

RELATED APPLICATION

This application is a continuation-in-part of application Ser. No. 11/941,853 filed 16 Nov. 2007, now U.S. Pat. No. 7,872,654.

TECHNICAL FIELD

The invention relates generally to integrated circuit (IC) sensors and more particularly to magnetoresistive IC angle sensors.

BACKGROUND

Magnetoresistive sensors can include anisotropic magnetoresistive (AMR), giant magnetoresistive (GMR), tunnel magnetoresistive (TMR) and other technologies, referred to collectively as xMR technologies. XMR sensors can be used for a variety of applications, including magnetic field and current sensors, speed sensors, rotation sensors and angle sensors, among others.

The accuracy of AMR angle sensors is limited by magnetic anisotropy and hysteresis effects. Key influencing factors are magnetic domains near the structure edge because the shape anisotropy caused by the demagnetizing field is strongest near the edge. Furthermore, defects at the edge related to the etch process can act as pinning centers that potentially lead to domain generation responsible for hysteresis effects. While shape anisotropy can be reduced by using wider AMR stripes, this requires bigger chip size as well as a larger signal field magnet.

In GMR and TMR angle sensors, however, AMR effects are parasitic and undesirable. TMR structures typically require a top contact and a bottom contact to induce a current perpendicular to the sensor plane. If a TMR current-in-plane (CIP-TMR) concept is used, the same structures as for GMR sensors can be used, obtaining a higher sensor signal. The main reasons for angle error remaining after full compensation are magnetic anisotropy effects and, as previously mentioned, AMR effects, which are considered parasitic. AMR effects can be suppressed by using shaped meanders having orthogonal strip length axes. In order to reduce any remaining anisotropy effect, the strip width can be made wider, thereby increasing the chip size, which is undesirable and increases cost.

Therefore, a need remains for an improved xMR sensor.

SUMMARY

Embodiments relate to xMR sensors, sensor elements and structures, and methods. In an embodiment, a sensor element comprises a non-elongated xMR structure; and a plurality of contact regions formed on the xMR structure spaced apart from one another such that a non-homogeneous current direction and current density distribution are induced in the xMR structure when a voltage is applied between the plurality of contact regions.

In an embodiment, a sensor comprises a first non-elongated xMR element having a plurality of contact regions formed on the first xMR element spaced apart from one another such that a locally non-homogenous current direction and current density distribution are induced in the first xMR element when a voltage is applied between the plurality of contact regions and a net current direction in the first xMR element defines a first axis; and a second non-elongated xMR element having a plurality of contact regions formed on the second xMR element spaced apart from one another such that a locally non-homogenous current direction and current density distribution are induced in the second xMR element when a voltage is applied between the plurality of contact regions and a net current direction in the second xMR element defines a second axis, the second axis being substantially orthogonal with respect to the first axis.

In an embodiment, a sensor element comprises a non-elongated xMR element; a first contact region formed on the xMR element and coupled to a first terminal; a second contact region formed on the xMR element and coupled to a second terminal and spaced apart from the first contact region along a first contact axis; and a third contact region formed on the xMR element and coupled to the second terminal and spaced apart from the first contact region along a second contact axis rotated ninety degrees with respect to the first contact axis.

In an embodiment, a method comprises forming an xMR sensor element; forming a plurality of contact regions on the xMR sensor element spaced apart from one another and proximate an edge of the xMR sensor element; and causing a current to flow in the xMR sensor element with a locally non-homogenous current direction and current density distribution.

BRIEF DESCRIPTION OF THE DRAWINGS

The invention may be more completely understood in consideration of the following detailed description of various embodiments of the invention in connection with the accompanying drawings, in which.

Figure 1:
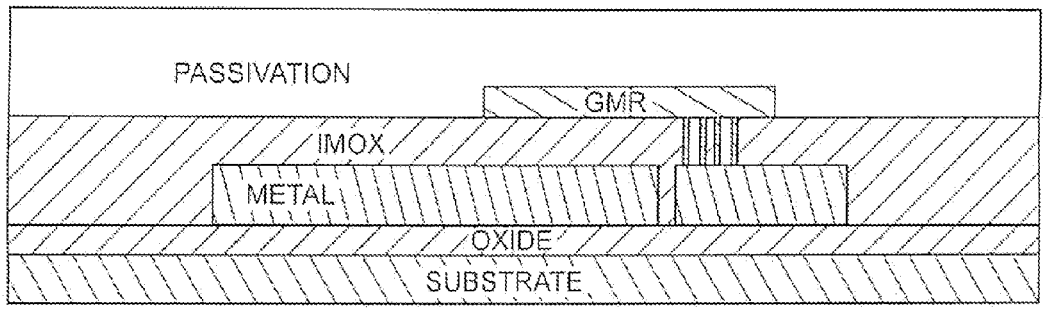
FIG. 1 is a block diagram of an xMR structure according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to xMR sensors having xMR structures with very low shape anisotropy effects. The xMR structures can comprise anisotropic magnetoresistive (AMR), giant magnetoresistive (GMR) or tunnel magnetoresistive (TMR) technologies. In embodiments, the xMR structures can be shaped such that they present orthogonal net current directions, for example being round. In other embodiments, the xMR structures can be square, oval, slightly rectangular, octagonal, hexagonal or have some other multi-sided configuration. In general, the xMR structures are non-elongated, having a width or first lateral dimension that is not significantly greater or less than a length or second lateral dimension taken at approximately ninety degrees from the first lateral dimension, or wherein a ratio of the first dimension to the second dimension is less than about 1.5 in embodiments. Embodiments also comprise point current contacts, strip current contacts or other contact and contact region structures configured to obtain a distribution of positive and negative angles with respect to the net current.

Embodiments thereby enable harmonic filtering effects to be utilized. Furthermore, the current density in embodiments is not homogeneous and is reduced in magnetically disadvantageous edge regions. Moreover, because of the contact design in embodiments the current distribution can be modified to achieve a variation of the angle distribution of the current directions and therefore to vary and tailor the harmonic filtering effect. In addition, the square resistance is significantly enhanced compared to a structure with homogeneous current distribution over the full structure width, thereby reducing the power consumption at the same sensor size.

Different contact designs can affect the distributions of current angles and current densities. When considering tailoring the contact design, a concept for a monolithic integration of AMR structures, such as is disclosed in commonly owned DE 10 2005 047482 A1 which is incorporated herein by reference in its entirety, can be considered. Referring to FIG. 1, contact between xMR portion, here depicted as GMR, to the wiring metal is made by conductive vias beneath an AMR structure. Because the via size can be as small as 0.4 micrometers (μm) by 0.4 μm in embodiments or can be of larger sizes, such as long vias or strip contacts, a variety of different contact designs is possible. Further, conductive vias can also be used to form highly conductive (as compared to the AMR material) regions to influence current distribution. In embodiments discussed in more detail below, contact regions comprise metal and/or are at least partially metallic.

Figure 2:
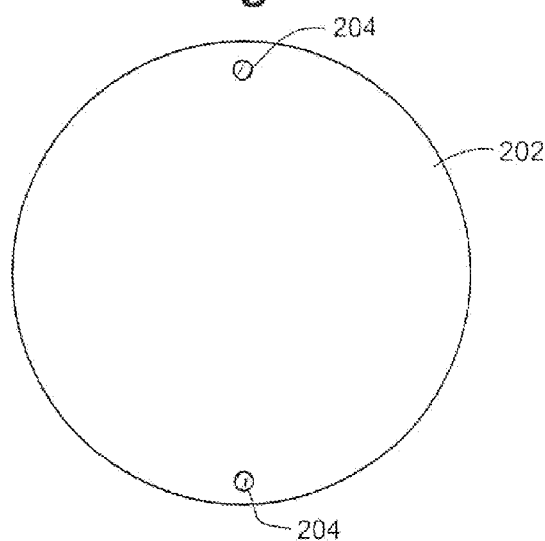
FIG. 2 is a diagram of an xMR structure according to an embodiment.

Therefore, and referring to FIG. 2, an embodiment of a circular xMR element or structure 202 is depicted, such as AMR in the embodiment of FIG. 2, in combination with point contact regions 204. Point contact regions 204 can be located proximate though spaced apart from an edge of xMR structure 202. In embodiments, point contact regions 204 can comprise vias to couple xMR structure 202 to an underlying wiring metal or other structure.

In one embodiment, a diameter of xMR structure 202 is about 14 μm and a diameter of contact regions 204 is about 1 μm or less, though these and other dimensions can vary in other embodiments. For example, a diameter of xMR structure 202 can vary from about 1 μm to about 100 μm or more in embodiments, such as about 5 μm to about 20 μm in embodiments. While xMR structure 202 is essentially round in the embodiment of FIG. 2, the shape can vary in other embodiments and can be, for example, oblong or multisided, such as a hexagon, octagon, square or some other shape.

Figure 3:
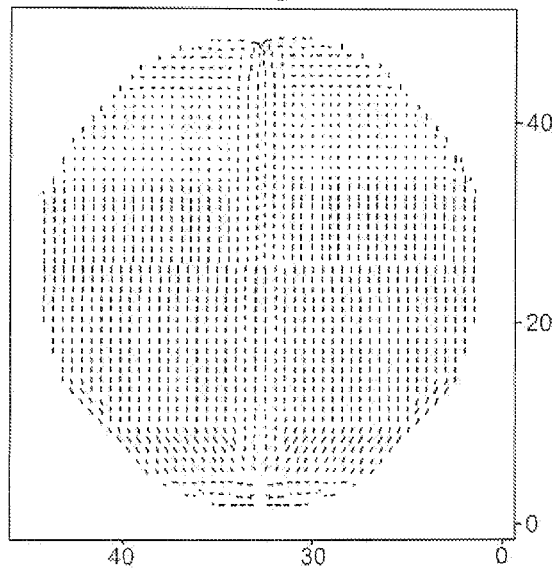
FIG. 3 is a diagram of simulated current direction distribution according to the embodiment of FIG. 2.

When a voltage is applied to contact regions 204, current directions vary locally. FIG. 3 depicts, for an embodiment of xMR structure 202, simulated local distribution of resulting current directions with respect to the vertical axis which is defined by the voltage gradient. FIG. 3 illustrates how the current direction distribution in structure 202 can be changed by tailoring the contact regions 204 as opposed to conventional attempts which altered the geometry of the xMR structure itself.

The AMR effect is proportional to $\sin(\alpha)^2$, with α being the angle between the magnetization and the current direction. Therefore, positive and negative angles with respect to the vertical axis are equivalent, as are the upper and lower halfspaces. Thus, only angles between 0 and ninety degrees are considered. In the example simulation depicted, the main current direction is along the vertical 0-degree axis, with another portion distributed between 0 degrees and forty-five degrees. In some regions near contacts 204 more horizontal directions with angles greater than forty-five degrees can be seen (refer, for example, to FIG. 5). In FIG. 3, the mean current direction without being weighted with the local current density is calculated to be about +/−22 degrees with respect to the vertical orientation.

Figure 4:
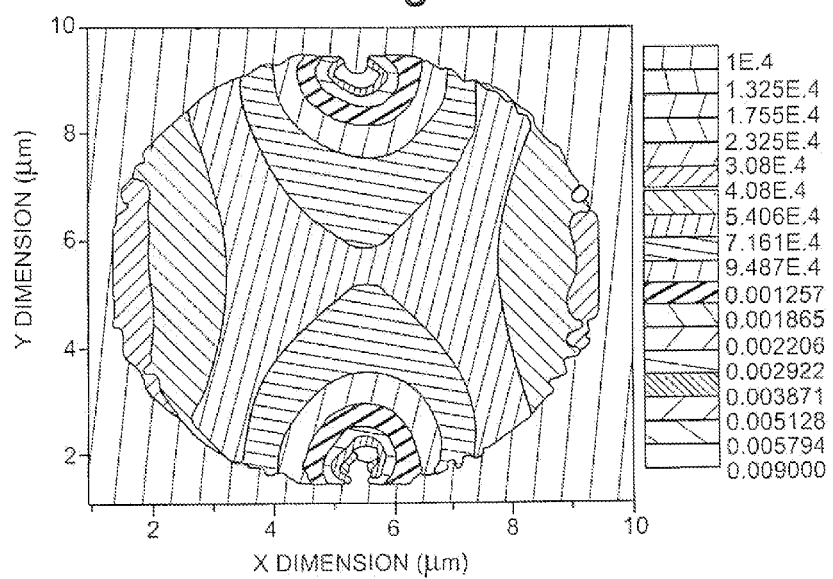
FIG. 4 is a diagram of simulated current density distribution according to the embodiment of FIG. 2.
Figure 5:
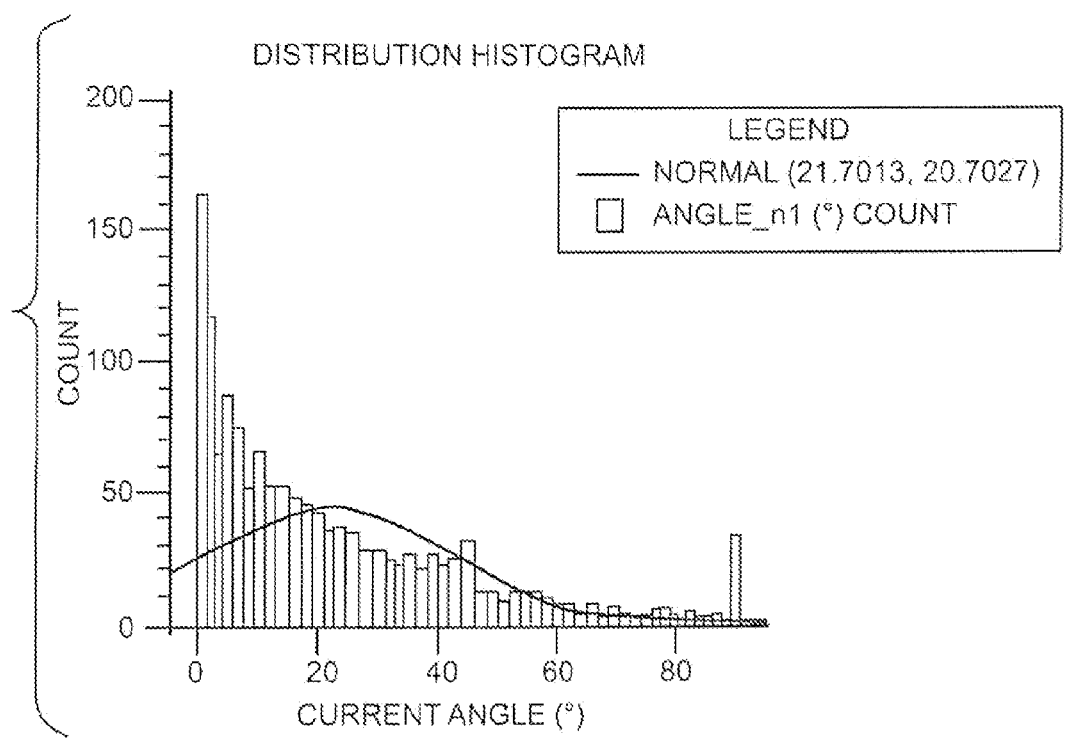
FIG. 5 is a distribution histogram of current angles with respect to the vertical axis for the 0-90 degree quadrant for the embodiment of FIG. 2.

FIG. 4 depicts simulated current density distribution for xMR structure 202. Due to the limited size of contact regions 204, the current density is not homogenous over xMR structure 202. As can be seen in FIG. 4, the left and right edges of xMR structure 202 exhibit lower current density compared with the central region. As a result, the edge regions, which are critical for magnetic performance, do not contribute fully to the electrical sensor signal, thereby reducing the angle error. The influence of the distribution of the current directions on the AMR output signal can be calculated by weighting the $\sin(\alpha)^2$ with the local current density. According to the numerical simulations, the AMR signal is expected to be about 47% lower compared with the case of a homogeneous current distribution. On the other hand, the resistance is increased by 92% in an embodiment. By comparison, in a strip structure embodiment with a homogenous current distribution this could only be achieved by an approximate halving of the strip width which would in turn relate to a significant increase in angle error. In FIG. 4, the resistance is about 1.9 squares. A corresponding distribution histogram is depicted in FIG. 5.

Figure 6A:
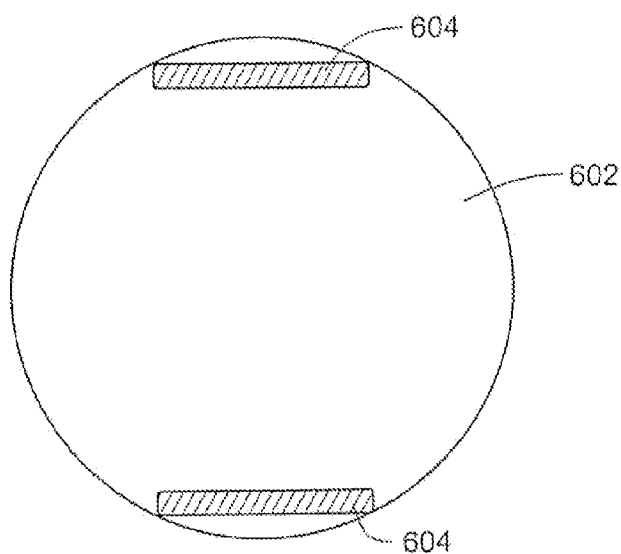
FIG. 6A is a diagram of an xMR structure according to an embodiment.
Figure 7:
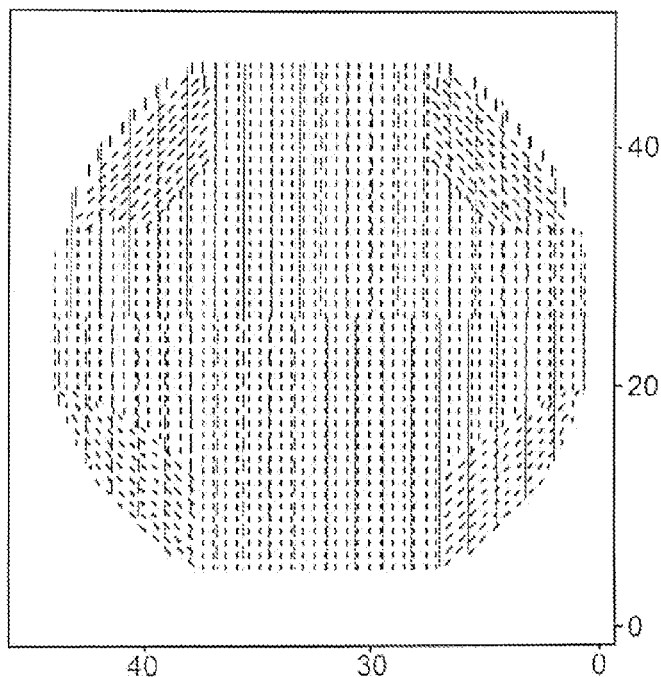
FIG. 7 is a diagram of simulated current direction distribution according to the embodiment of FIG. 6.
Figure 8:
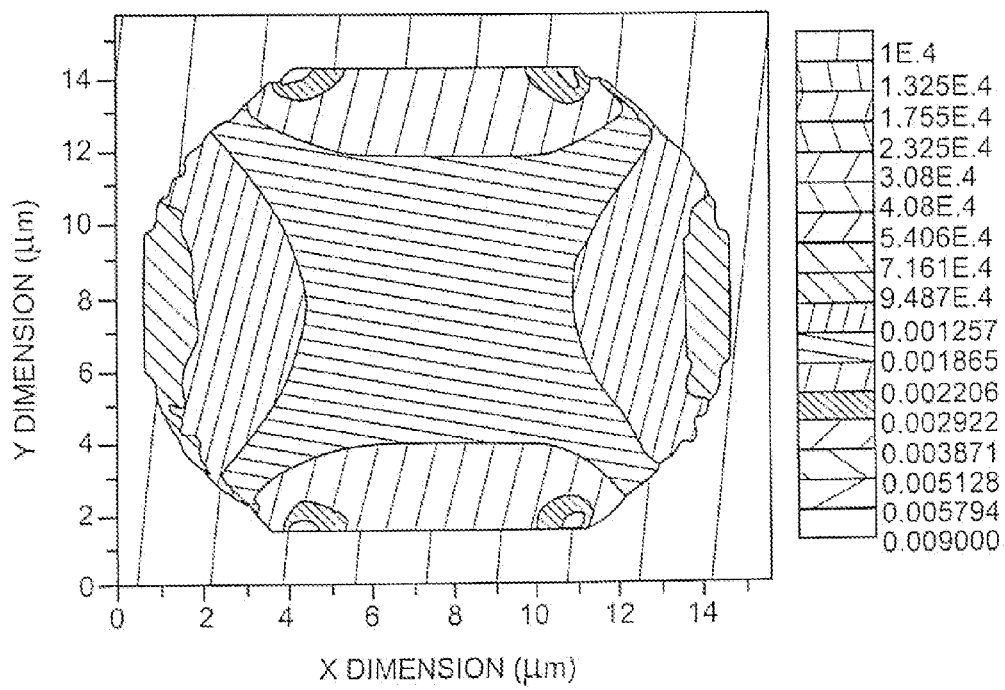
FIG. 8 is a diagram of simulated current density distribution according to the embodiment of FIG. 6.
Figure 9:
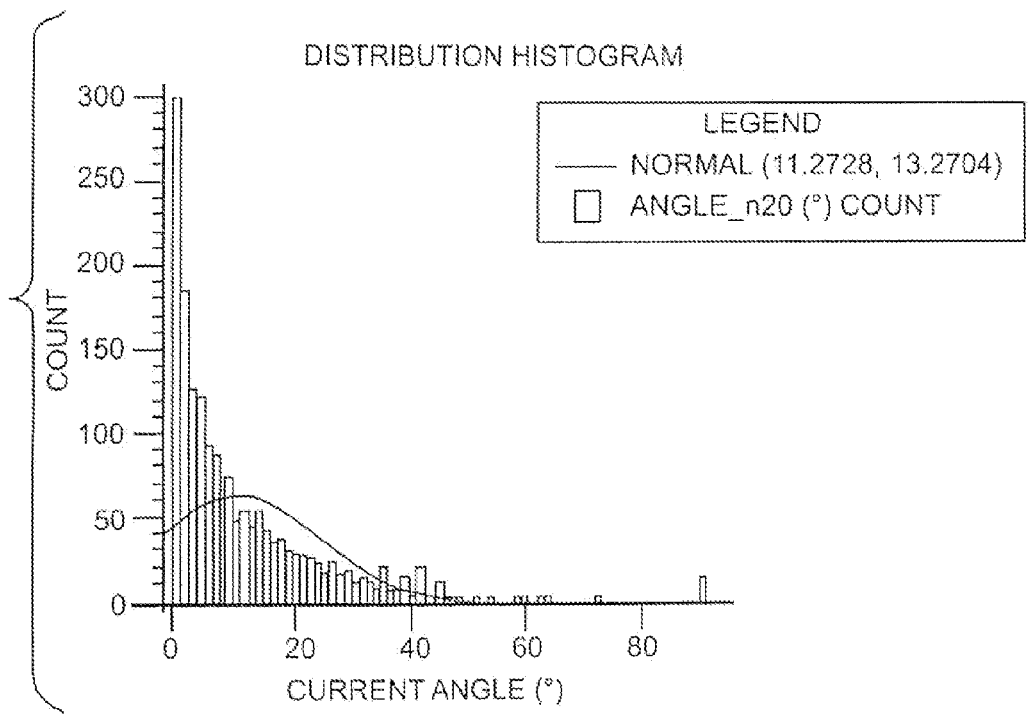
FIG. 9 is a distribution histogram of current angles with respect to the vertical axis for the 0-90 degree quadrant for the embodiment of FIG. 6.

Another embodiment of an xMR structure or element 602 is depicted in FIG. 6A. XMR structure 602 comprises two long, strip-like via contacts 604. As can be seen in FIG. 7, the simulated current directions in the embodiment of FIG. 6A are more aligned along the vertical axis, which can also be seen in a much narrower current direction distribution in FIG. 8, resulting in an average current angle with respect to the vertical axis of about +/−11 degrees. A corresponding distribution histogram is depicted in FIG. 9.

In the embodiment of FIG. 6A, the AMR signal is expected to be about 14% lower compared with the case of homogeneous current distribution. On the other hand, the resistance is about 20% higher in an embodiment.

Figure 6B:
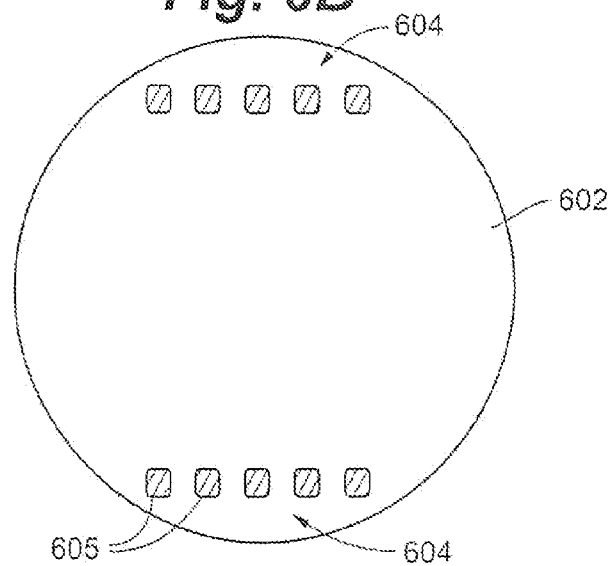
FIG. 6B is a diagram of an xMR structure according to an embodiment.
Figure 6C:
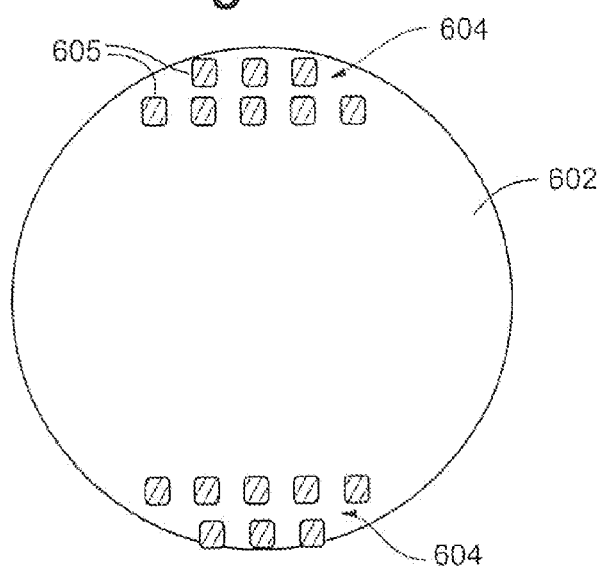
FIG. 6C is a diagram of an xMR structure according to an embodiment.

Other embodiments are depicted in FIGS. 6B and 6C, in which xMR structure 602 is at least somewhat analogous to the embodiment FIG. 6A. In FIG. 6B, xMR structure 602 comprises two strip-like contacts 604 each comprising a plurality of spaced apart single vias 605. For redundancy, such as to ensure sensor functionality in the case that a particular via 605 loses its contact by, e.g., delamination, vias 605 can be positioned in a second line or array as depicted in FIG. 6C. Vias 605 generally do not influence the current distribution in xMR structure 602 as long as vias 605 in at least one line exhibit a suitable contact 604 for xMR structure 602. The number, placement and configuration of contacts 604 and vias 605 can vary in other embodiments, for example by comprising more or fewer vias 605 or in other arrangements with respect to each other and xMR structure 602 than as depicted in FIG. 6. Further, other embodiments depicted and discussed elsewhere herein can also comprise contacts having pluralities of vias.

The xMR structures 202 and 602 of FIGS. 2 and 6, respectively, demonstrate how different contact designs can influence the current distribution and therefore the effect on the harmonic filtering effect as well as the specific resistance. Other embodiments not specifically depicted include varying circular or multi-sided xMR structure configurations in combination with varying point, strip and other contact and contact region configurations. The ability to vary the configurations and/or combinations gives rise to numerous advantages in embodiments. For example, advantages of circular or multi-sided AMR structures as disclosed herein can include low shape anisotropy with lower angle error and lower hysteresis; when combined with varying contact designs, advantages can further include adjustable current direction distribution and adjustable harmonic filtering effects as well as adjustable current density distribution, further reduced shape anisotropy effects, further reduced hysteresis effects and increased specific resistance.

Figure 10:
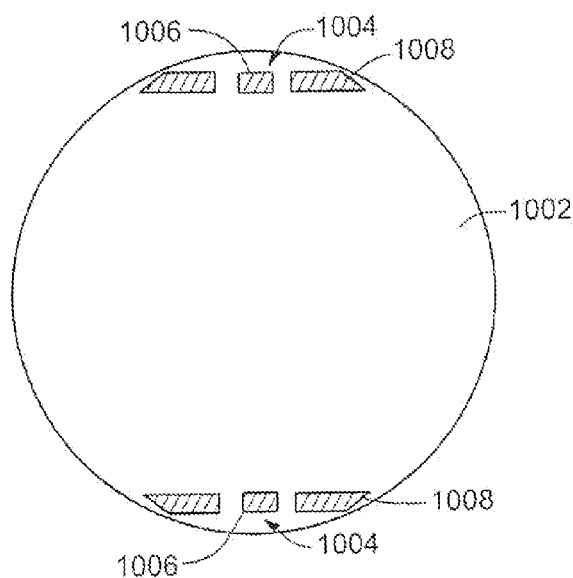
FIG. 10 is a diagram of an xMR structure according to an embodiment.
Figure 11:
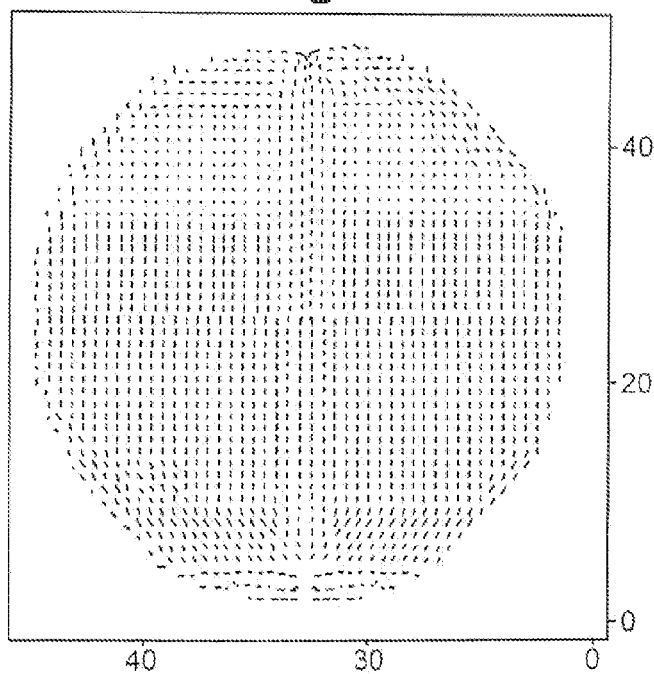
FIG. 11 is a diagram of simulated current direction distribution according to the embodiment of FIG. 10.
Figure 12:
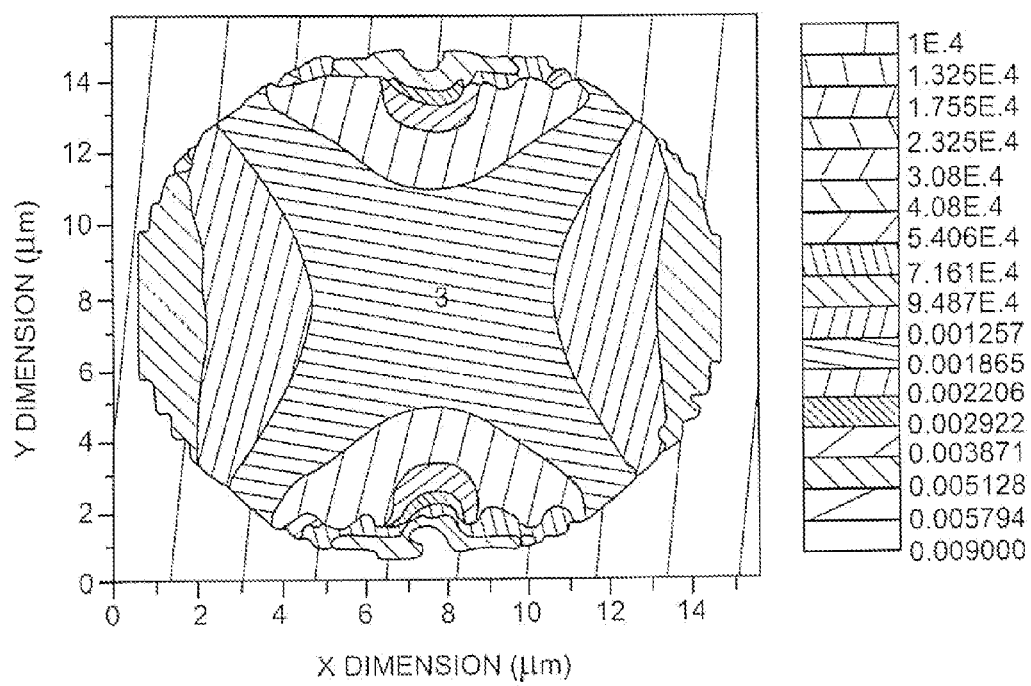
FIG. 12 is a diagram of simulated current density distribution according to the embodiment of FIG. 10.
Figure 13:
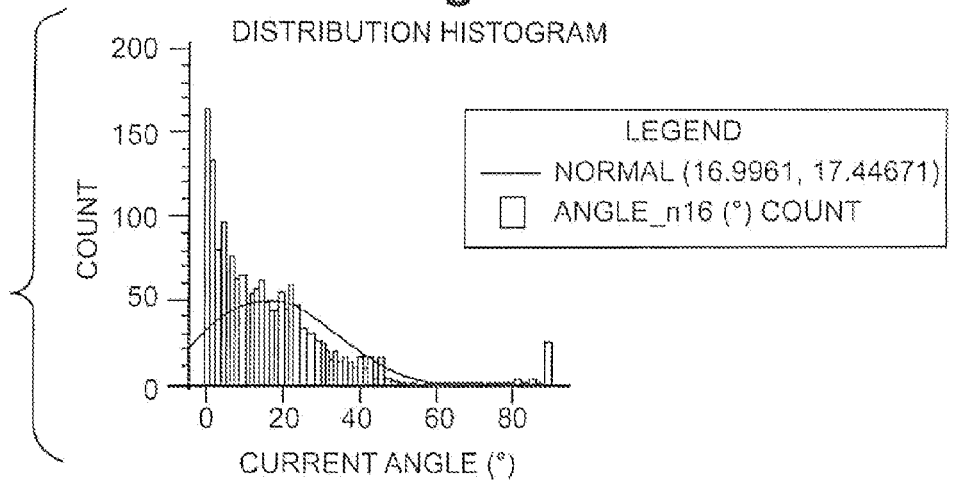
FIG. 13 is a distribution histogram of current angles with respect to the vertical axis for the 0-90 degree quadrant for the embodiment of FIG. 10.

Another embodiment is depicted in FIG. 10 in which an xMR structure or element 1002 comprises another contact design. Each contact region 1004 comprises a point contact 1006 and two adjacent conducting and electrically isolated strip structures 1008. Strip structures 1008 are generally highly conductive, with conductivity depending upon the geometric size and, in embodiments, being from about five times to about fifty times higher compared with the AMR/GMR sheet resistance. Strip structures 1008 are not directly coupled to a voltage in an embodiment. Because of the higher conductivity of strip structures 1008 compared to the AMR material of xMR structure 1002, the electric field distribution is varied, resulting in a current direction distribution similar to the strip contact embodiment depicted in FIG. 6. In the embodiment of FIG. 10 and also referring to FIG. 11, the average current direction is about +/−17 degrees, resulting in an AMR signal expected to be about 32% lower and a specific resistance which is about 62% higher compared to the case of a homogeneous current distribution. FIG. 12 depicts simulated current density distribution for xMR structure 1002, while FIG. 13 is a histogram of current angle distribution with respect to the vertical axis.

Figure 14:
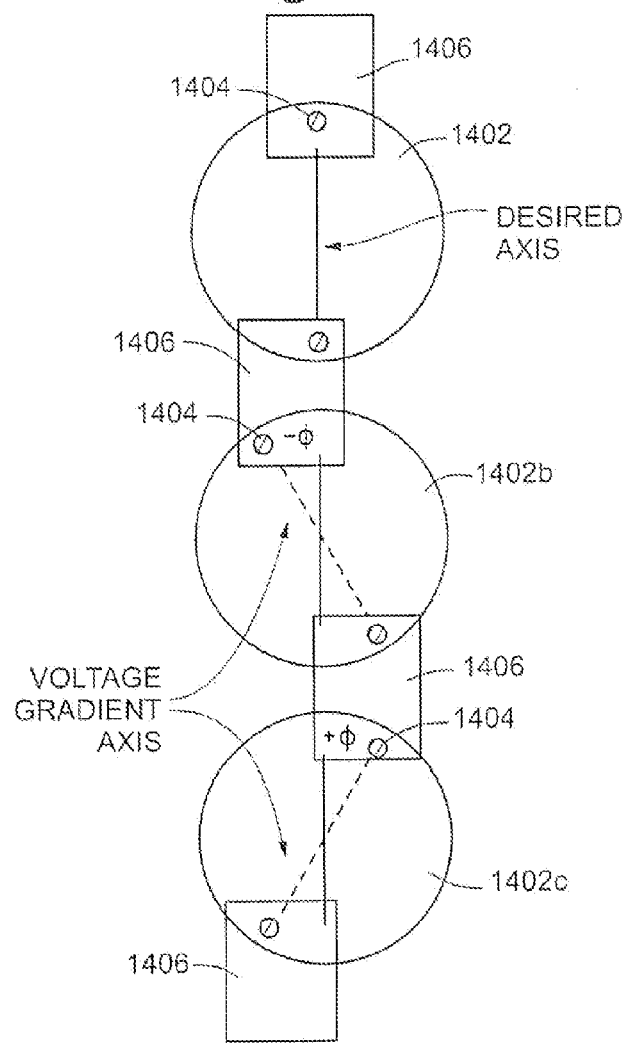
FIG. 14 is a diagram of an xMR structure according to an embodiment.

In an embodiment, a plurality of xMR structures or elements are coupled serially, such as is depicted in FIG. 14. Such a configuration can be implemented if an extension of the current direction distribution is desired or required. In the embodiment of FIG. 14, the serial coupling of a plurality of xMR structures 1402 can provide varying tilt angles of the vertical axis, or voltage gradient, such that a desired axis can be obtained. For effective harmonic filtering, the tilt angles are paired equally positive and negative. In other words, a first angle, −ϕ, is formed between the voltage gradient axis of structure 1402b and the desired axis, and a second angle, +ϕ, is formed between the voltage gradient axis of structure 1402c and the desired axis, the first and second angles being equal but having opposing signs. In an embodiment, the contacts 1404 of adjacent xMR structures 1402 are coupled by metal connectors 1406, though the size, shape, configuration and orientation of the connectors 1406 can vary in embodiments from as depicted in the embodiment of FIG. 14.

As previously mentioned, the AMR effect desired in AMR embodiments is parasitic in GMR and TMR embodiments. Therefore, in these and perhaps other embodiments it is desired to suppress the AMR effect. In embodiments, this can be accomplished at least in part by implementing circular or multi-sided GMR and TMR structures, such as discussed herein above, in combination with an orthogonal current feed. This provides a structure with a minimum shape anisotropy, e.g. round, and therefore a minimum angle error. Because the sensor layer often comprises an NiFe alloy, the AMR effect in GMR and TMR devices contributes to the remaining angle error. A combination of GMR/TMR elements exhibiting orthogonal current directions will lead to cancelation of the AMR-induced resistance change and, therefore, to a suppression of the AMR effect influence on angle accuracy in embodiments.

Figure 15:
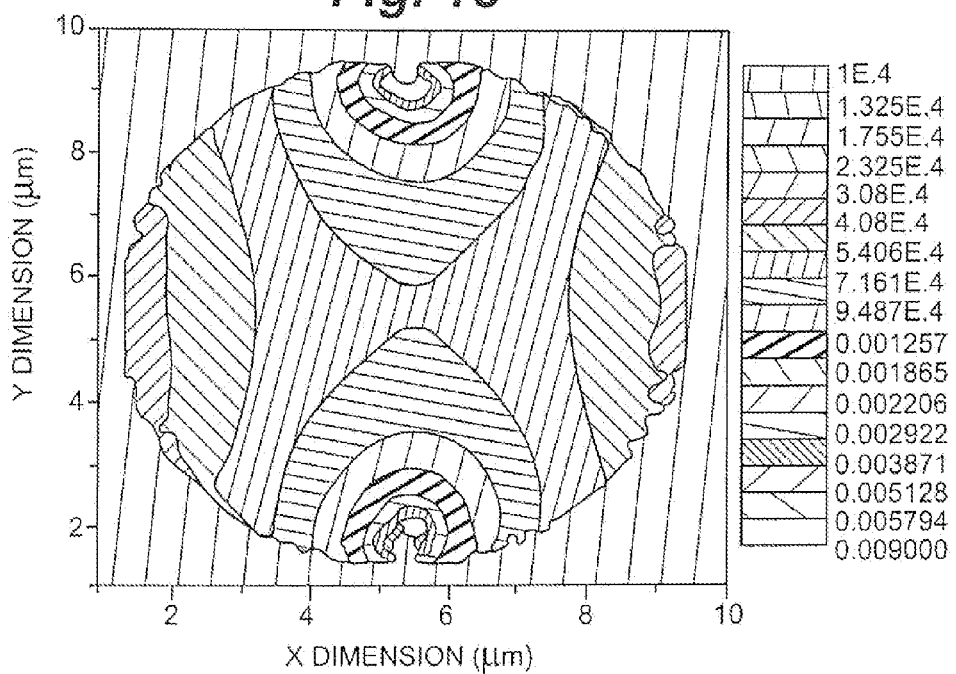
FIG. 15 is a diagram of simulated current density distribution according to an embodiment.

An embodiment of a GMR or TMR device is very similar or identical to the device of FIG. 2 except that xMR structure 202 comprises a GMR or TMR structure or element. According to simulations of embodiments, the point contact design of contacts 204 results in a non-homogenous current distribution: most of the carriers flow in the middle region of GMR/TMR structure 202, which is favorable with respect to an output signal of low anisotropy error since the edge regions exhibit a disadvantageous magnetic behavior. A significant advantage of the configuration of point contacts 204 in embodiments is an enhanced specific resistance, such as almost a doubling in an embodiment, which enables a reduction of the active GMR/TMR area at a certain total resistance. Simulated current density is depicted in FIG. 15.

Figure 16:
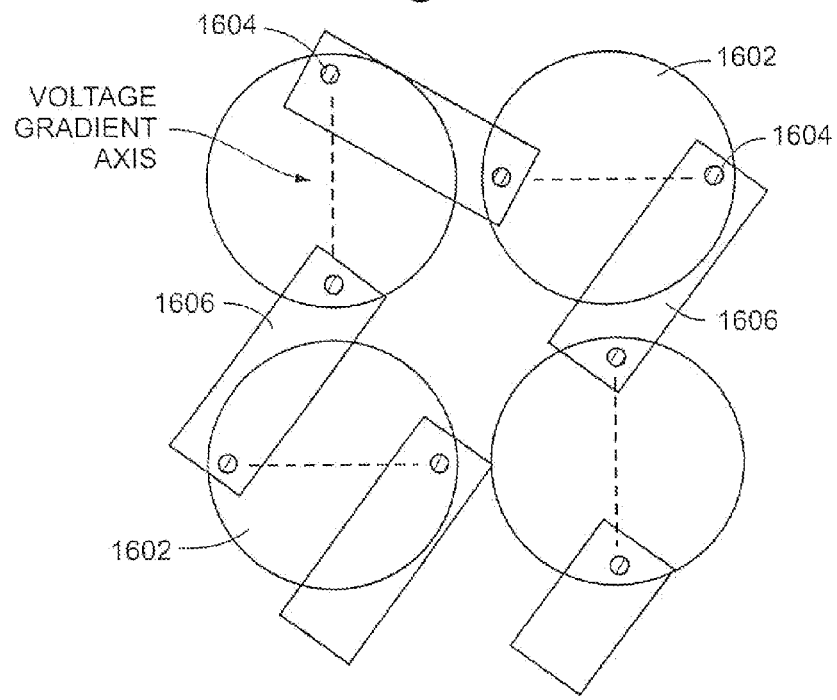
FIG. 16 is a diagram of an xMR structure according to an embodiment.

To suppress a resistance modulation due to AMR effects in GMR/TMR embodiments, an equal number of elements orthogonally oriented with respect to each other and the voltage gradient axis, a plurality of GMR/TMR structures can be serially coupled, such as is depicted in FIG. 16. FIG. 16 depicts a plurality of GMR/TMR structures 1602, each comprising point contacts 1604, coupled by connectors 1606. In an embodiment, connectors 1606 comprise metal connectors.

Figure 17:
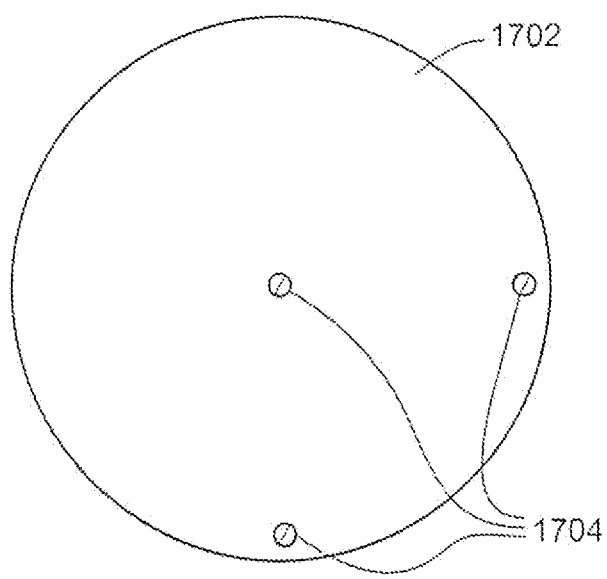
FIG. 17 is a diagram of an xMR structure according to an embodiment.
Figure 18:
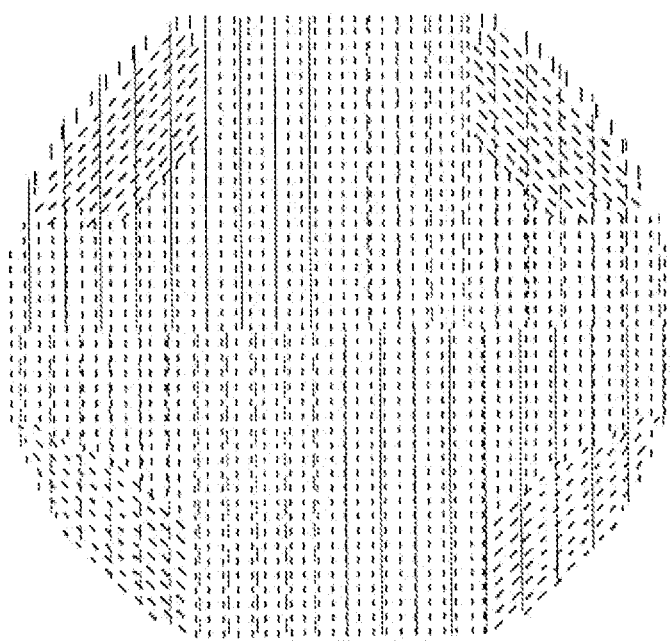
FIG. 18 is a diagram of simulated current direction distribution according to the embodiment of FIG. 17.
Figure 19:
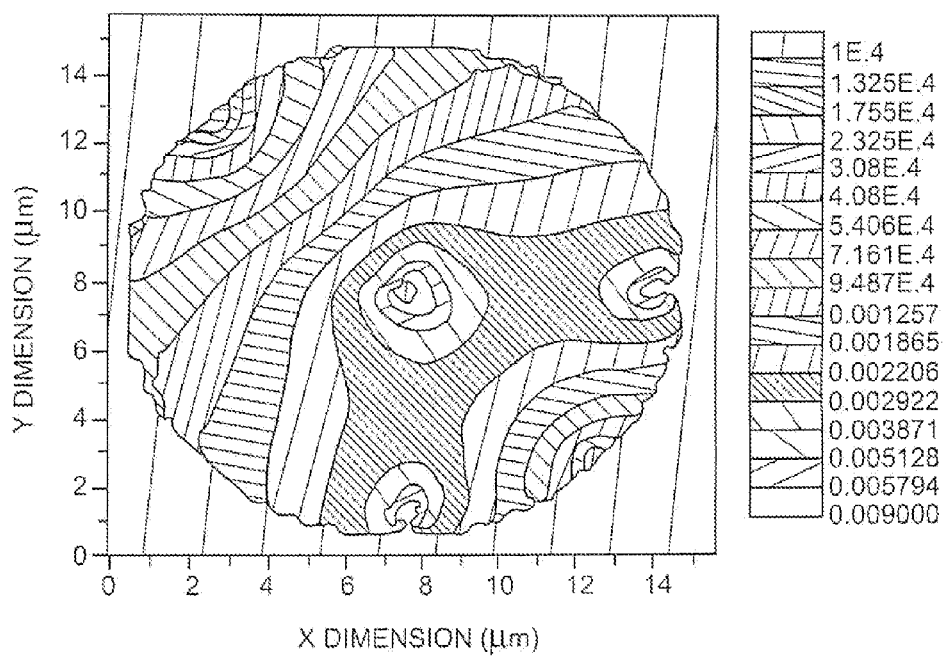
FIG. 19 is a diagram of simulated current density distribution according to the embodiment of FIG. 17.

Another embodiment is depicted in FIG. 17. In FIG. 17, a GMR/TMR structure or element 1702 comprises a plurality of point contacts 1704. The three contacts 1704 are arranged such that one is generally positioned in the center of GMR/TMR structure 1702, coupled to a first terminal, and two are located near the edge defining an angle of 90 degrees and coupled to a second terminal. As a result, element 1700 exhibits two parallel current paths which are orthogonal to each other, such as can be seen in the simulation results of FIG. 18. Simulated current density is depicted in FIG. 19. Although the specific resistance decreases, it is still about 0.7 squares in an embodiment, which is within a reasonable range. An advantage of the embodiment of FIG. 17 is that AMR effect-based resistance modulation is suppressed in a single element.

Figure 20:
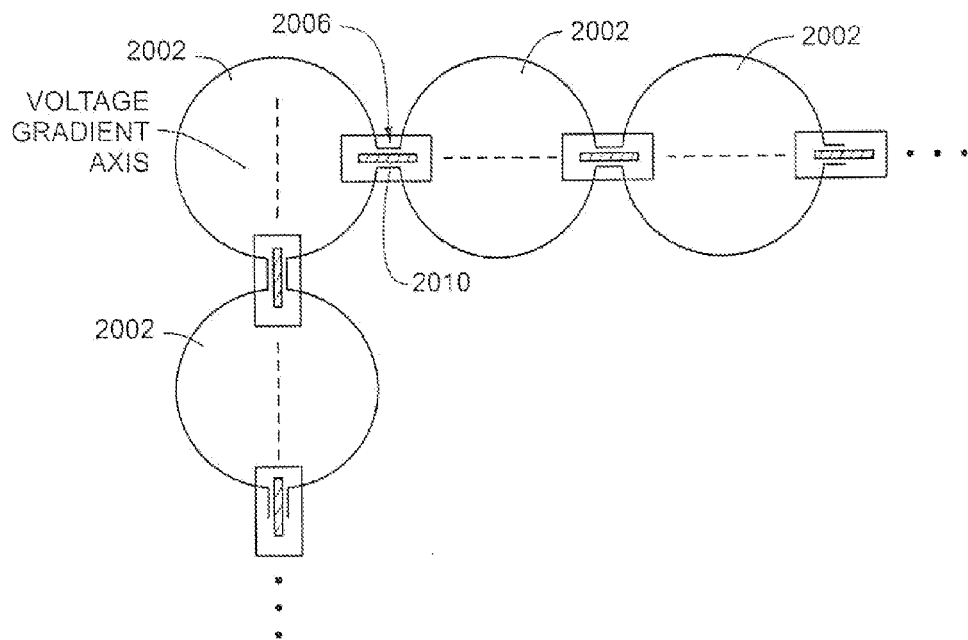
FIG. 20 is a diagram of an xMR structure according to an embodiment.

Another multi-element embodiment is depicted in FIG. 20. Here, GMR/TMR structures 2002 remain coupled by GMR/TMR bridges 2006 with underlying vias 2010. In embodiments, bridges 2006 have widths in a range of about 0.1 μm to about 10 μm, such as about 0.5 μm to about 2 μm, and lengths in a range of about 0.1 μm to about 10 μm, such as about 0.5 μm to about 2 μm. In other embodiments, more or fewer GMR/TMR structures 2002 can be coupled, and the structures 2002 can be coupled in alternate configurations, keeping in mind that an equal number of elements orthogonally oriented with respect to each other and the voltage gradient axis is desired. In another embodiment, alternate contact configurations are used for a shortening of the GMR/TMR bridge 2006 configuration, such as single via contacts in combination with a wiring metal as depicted in FIG. 14.

Another embodiment comprises an AMR element according to FIG. 16, FIG. 17 or FIG. 20. In some applications, it can be necessary to provide AMR resistors with certain temperature coefficients of resistance without exhibiting a magnetoresistive effect when an external magnetic field is applied. For example, a Wheatstone half-bridge can be realized with such an element.

Various embodiments of xMR sensor structures, including AMR, GMR and/or TMR, have been discussed herein. These structures can have various configurations in embodiments, including round or multi-sided, and are combined with contacts and contact regions having various arrangements and configurations, including point, strip, multi-portioned and others. Embodiments are not limited to those specifically depicted or discussed, as various other combinations, configurations and arrangements can be formed, as understood by those skilled in the art. As discussed, embodiments having varying and various contact and contact region configurations enable alteration of the current direction distribution in the underlying xMR structure, as compared with conventional approaches which altered the geometry of the xMR structure itself.

Various embodiments of systems, devices and methods have been described herein. These embodiments are given only by way of example and are not intended to limit the scope of the invention. It should be appreciated, moreover, that the various features of the embodiments that have been described as well as of the claims may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments and/or from different claims, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor element comprising:
a non-elongated xMR structure; and
a plurality of contact regions formed on the xMR structure spaced apart from one another such that a non-homogeneous current direction and current density distribution are induced in the xMR structure when a voltage is applied between the plurality of contact regions,
wherein a net current direction of the sensor element defines a desired axis, wherein a first of the plurality of xMR structures has a first angle between its axis and the desired axis, and wherein a second of the plurality of xMR structures has a second angle between its axis and the desired axis, the first and second angles being equal but having opposing signs.

2. The sensor element of claim 1, wherein the plurality of contacts regions are each proximate an edge of the xMR structure.

3. The sensor element of claim 1, wherein a first axis is defined in a direction of a maximum lateral dimension of the xMR structure and a second axis is defined substantially perpendicular to the first axis, wherein a ratio of dimensions of the xMR structure along the first and second axes is less than about 1.5.

4. The sensor element of claim 1, wherein the xMR structure has equal lateral dimensions.

5. The sensor element of claim 1, wherein the xMR structure is rotationally symmetrical.

6. The sensor element of claim 1, wherein the xMR structure is multi-sided, and wherein junctions between adjacent sides of the multi-sided xMR structure follow a rotational symmetry.

7. The sensor element of claim 1, wherein the xMR structure is multi-sided, and wherein junctions between adjacent sides of the multi-sided xMR structure are substantially uniformly distributed on a circle.

8. The sensor element of claim 1, wherein the xMR structure has a radius.

9. The sensor element of claim 8, wherein the xMR structure is substantially round.

10. The sensor element of claim 1, further comprising at least one highly conductive region disposed adjacent at least one of the plurality of contact regions.

11. The sensor element of claim 1, comprising a plurality of xMR structures serially coupled.

12. The sensor element of claim 1, wherein the plurality of contact regions comprise vias.

13. The sensor element of claim 1, wherein the plurality of contact regions comprise strips.

14. The sensor element of claim 1, wherein the plurality of contact regions are configured to provide an increased resistance of the xMR structure compared to a resistance associated with a homogeneous current density distribution.

15. The sensor element of claim 1, wherein a diameter of the xMR structure is in a range of about 1 micrometer (μm) to about 100 μm.

16. The sensor element of claim 15, wherein the diameter of the xMR structure is in a range of about 5 μm to about 20 μm.

17. A sensor comprising:
a first non-elongated xMR element having a plurality of contact regions formed on the first xMR element spaced apart from one another such that a locally non-homogenous current direction and current density distribution are induced in the first xMR element when a voltage is applied between the plurality of contact regions and a net current direction in the first xMR, element defines a first axis; and
a second non-elongated xMR element having a plurality of contact regions formed on the second xMR element spaced apart from one another such that a locally non-homogenous current direction and current density distribution are induced in the second xMR element when a voltage is applied between the plurality of contact regions and a net current direction in the second xMR element defines a second axis, the second axis being substantially orthogonal with respect to the first axis.

18. The sensor of claim 17, wherein the plurality of contacts regions are each proximate an edge of a respective xMR structure.

19. The sensor of claim 17, wherein at least one of the first or second xMR elements comprises one of a giant magnetoresistive (GMR) element or a tunnel magnetoresistive (TMR) element.

20. The sensor of claim 17, wherein at least one of the first or second xMR elements comprises an anisotropic magnetoresistive (AMR) element, and wherein the AMR element is insensitive with respect to an external magnetic field.

21. The sensor of claim 17, wherein the second xMR element is coupled to the first xMR element by an xMR portion.

22. The sensor of claim 21, wherein the xMR portion has a width in a range of about 0.1 micrometers (μm) to about 10 μm and a length in a range of about 0.1 μm to about 10 μm.

23. The angle sensor of claim 21, further comprising a conductive region arranged proximate the xMR portion.

24. The angle sensor of claim 17, wherein the first and second xMR elements are coupled to form one of a Wheatstone full-bridge configuration or a Wheatstone half-bridge configuration.

* * * * *